United States Patent
Kim et al.

(10) Patent No.: US 12,482,427 B2
(45) Date of Patent: Nov. 25, 2025

(54) DISPLAY DEVICE INCLUDING GATE DRIVING CIRCUIT AND LINK LINE

(71) Applicant: LG Display Co., Ltd., Seoul (KR)

(72) Inventors: Dong-Myoung Kim, Paju-si (KR); Hong-Jae Shin, Paju-si (KR); Yong-Ho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/582,103

(22) Filed: Feb. 20, 2024

(65) Prior Publication Data

US 2024/0290279 A1   Aug. 29, 2024

(30) Foreign Application Priority Data

Feb. 28, 2023   (KR) .................. 10-2023-0026960

(51) Int. Cl.
*G09G 3/3266* (2016.01)
*G09G 3/32* (2016.01)
*H10K 59/121* (2023.01)
*H10K 59/122* (2023.01)
*H10K 59/80* (2023.01)

(52) U.S. Cl.
CPC .......... *G09G 3/3266* (2013.01); *G09G 3/32* (2013.01); *H10K 59/1213* (2023.02); *H10K 59/1216* (2023.02); *H10K 59/122* (2023.02); *H10K 59/873* (2023.02); *H10K 59/8792* (2023.02); *G09G 2310/0267* (2013.01); *G09G 2310/08* (2013.01); *G09G 2330/06* (2013.01)

(58) Field of Classification Search
CPC ............... G09G 3/3266; G09G 3/32; G09G 2310/0267; G09G 2310/08; G09G 2330/06; H10K 59/122; H10K 59/1213; H10K 59/873; H10K 59/1216; H10K 59/8792

See application file for complete search history.

(56) References Cited

U.S. PATENT DOCUMENTS

2020/0303421 A1*   9/2020   Cho .................... G09G 3/3275
2021/0142737 A1*   5/2021   Kim .................... G09G 3/3266

\* cited by examiner

*Primary Examiner* — Lisa S Landis
(74) *Attorney, Agent, or Firm* — Fenwick & West LLP

(57) ABSTRACT

A display apparatus includes a substrate including a display area having a subpixel and a non-display area surrounding the display area, a driving transistor and a light emitting diode provided at the subpixel, a gate driving unit provided in the non-display area, and a link line provided in the non-display area and connected to the gate driving unit, wherein the link line includes a first link portion of a first direction, a second link portion of a second direction, and a third link portion connecting the first link portion and the second link portion and having a substantially curved shape.

26 Claims, 9 Drawing Sheets

DISPLAY DEVICE INCLUDING GATE DRIVING CIRCUIT AND LINK LINE

CROSS-REFERENCE TO RELATED APPLICATION

The present application claims priority to Republic of Korea Patent Application No. 10-2023-0026960 filed in the Republic of Korea on Feb. 28, 2023, which is hereby incorporated by reference in its entirety.

FIELD OF THE DISCLOSURE

The present disclosure relates to a display apparatus, and more particularly, to a display apparatus including a gate driving unit provided on a substrate.

DISCUSSION OF THE BACKGROUND ART

Recently, with the advent of an information-oriented society, the interest in information displays for processing and displaying a massive amount of information and the demand for portable information media have increased. As such, a display field has rapidly advanced. Thus, various light and thin flat panel display devices have been developed and highlighted.

Among the various flat panel display devices, an organic light-emitting diode (OLED) display apparatus is an emissive type device that does not include a backlight unit used in a non-emissive type device such as a liquid crystal display (LCD) apparatus. As a result, the OLED display apparatus has advantages in a viewing angle, a contrast ratio and a power consumption to be applied to various fields.

The OLED display apparatus includes a plurality of subpixels in a display area, and each subpixel receives signals from a gate driving unit and a data driving unit to implement an image.

SUMMARY

Recently, in the organic light emitting diode display apparatus, the gate driving unit may be provided as a gate in panel (GIP) type in a non-display area, thereby reducing manufacturing costs and processes.

However, an input signal applied to the gate driving unit may be non-uniform, resulting in a difference in an output signal. Therefore, a gate dim may occur, and there is a problem in that an image quality of the display apparatus may be lowered.

Accordingly, the present disclosure is to provide a display apparatus that substantially obviates one or more of the limitations and disadvantages described above and associated with the background art.

More specifically, an object of the present disclosure is to provide a display apparatus capable of inputting a uniform potential to a gate driving unit.

Another object of the present disclosure is to provide a display apparatus capable of improving an image quality.

Additional features and aspects will be set forth in the description that follows, and in part will be apparent from the description, or can be learned by practice of the present disclosure provided herein. Other features and aspects of the inventive concepts can be realized and attained by the structure particularly pointed out in the written description, or derivable therefrom, and the claims hereof as well as the appended drawings.

To achieve these and other aspects of the present disclosure, as embodied and broadly described herein, a display apparatus includes a substrate including a display area having a subpixel and a non-display area surrounding the display area, a driving transistor and a light emitting diode provided at the subpixel, a gate driving unit provided in the non-display area, and a link line provided in the non-display area and connected to the gate driving unit, wherein the link line includes a first link portion of a first direction, a second link portion of a second direction, and a third link portion connecting the first link portion and the second link portion and having a substantially curved shape.

It is to be understood that both the foregoing general description and the following detailed description are examples and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION

Figure 1:
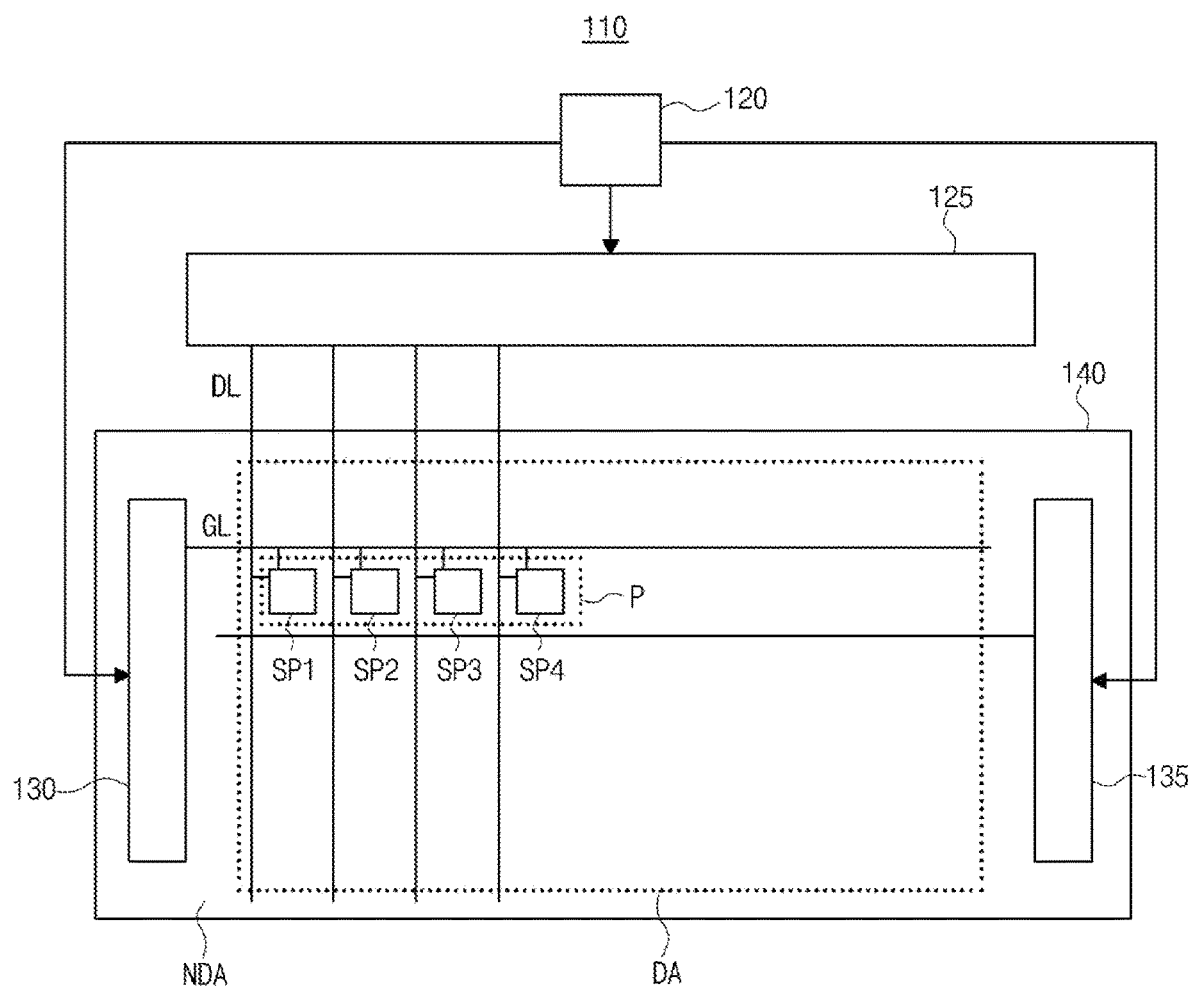
FIG. 1 is a view showing a display apparatus according to an embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the present disclosure is only defined by scopes of claims.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals refer to like elements throughout the specification, unless otherwise specified.

In the following description, where the detailed description of the relevant known function or configuration may unnecessarily obscure a feature or aspect of the present disclosure, a detailed description of such known function or configuration may be omitted or a brief description may be provided.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or a tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Although the terms "first," "second," A, B, (a), (b), and the like may be used herein to refer to various elements, these elements should not be interpreted to be limited by these terms as they are not used to define a particular order or precedence. These terms are only used to distinguish one element from another. For example, a first element could be termed a second element, and, similarly, a second element could be termed a first element, without departing from the scope of the present disclosure.

The term "at least one" should be understood to include all combinations of one or more of related elements. For example, the term of "at least one of first, second and third elements" may include all combinations of two or more of the first, second and third elements as well as the first, second or third element.

The term "display apparatus" may include a display device in a narrow sense such as liquid crystal module (LCM), an organic light emitting diode (OLED) module and a quantum dot (QD) module including a display panel and a driving unit for driving the display panel. In addition, the term "display apparatus" may include a complete product (or a final product) including the LCM, the OLED module and the QD module such as a notebook computer, a television, a computer monitor, an equipment display device including an automotive display apparatus or a shape other than a vehicle, and a set electronic apparatus or a set device (or a set apparatus) such as a mobile electronic apparatus of a smart phone or an electronic pad.

Accordingly, a display apparatus of the present disclosure may include an applied product or a set device of a final user's device including the LCM, the OLED module and the QD module as well as a display apparatus in a narrow sense such as the LCM, the OLED module and the QD module.

According to circumstances, the LCM, the OLED module and the QD module having a display panel and a driving unit may be expressed as "a display apparatus", and an electronic apparatus of a complete product including the LCM, the OLED module and the QD module may be expressed as "a set device." For example, a display apparatus in a narrow sense may include a display panel of a liquid crystal, an organic light emitting diode and a quantum dot and a source printed circuit board (PCB) of a control unit for driving the display panel, and a set device may further include a set PCB of a set control unit electrically connected to the source PCB for controlling the entire set device.

The display panel of the present disclosure may include all kinds of display panels such as a liquid crystal display panel, an organic light emitting diode display panel, a quantum dot display panel and an electroluminescent display panel. The display panel of the present disclosure is not limited to a specific display panel of a bezel bending having a flexible substrate for an organic light emitting diode display panel and a lower back plate supporter. A shape or a size of the display panel for the display apparatus of the present disclosure is not limited thereto.

For example, when the display panel is an organic light emitting diode display panel, the display panel may include a plurality of gate lines, a plurality of data lines and a subpixel in a crossing region of the plurality of gate lines and the plurality of data lines. The display panel may include an array having a thin film transistor of an element for selectively applying a voltage to each subpixel, an emitting element layer on the array and an encapsulating substrate or an encapsulation part covering the emitting element layer. The encapsulation part may protect the thin film transistor and the emitting element layer from an external impact and may prevent or at least reduce penetration of moisture or oxygen into the emitting element layer. In addition, a layer on the array may include an inorganic light emitting layer, for example, a nano-sized material layer or a quantum dot.

The thin film transistor of the present disclosure may include one of an oxide thin film transistor, an amorphous silicon thin film transistor, a low temperature polycrystalline silicon thin film transistor.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Hereinafter, a display apparatus according to various example embodiments of the present disclosure where an influence on an oxide semiconductor layer of a thin film transistor of a driving element part is reduced by shielding a light emitted and transmitted from a subpixel and/or a light inputted from an exterior will be described in detail with reference to the accompanying drawings.

FIG. 1 is a view showing a display apparatus according to an embodiment of the present disclosure. The display apparatus may be an organic light emitting diode (OLED) display apparatus.

In FIG. 1, a display apparatus 110 according to an embodiment of the present disclosure includes a timing controlling unit 120, a data driving unit 125, a first gate driving unit 120, a second gate driving unit 135, and a display panel 140.

The timing controlling unit 120 (e.g., a circuit) generates an image data, a data control signal and a gate control signal using an image signal and a plurality of timing signals including a data enable signal, a horizontal synchronization signal, a vertical synchronization signal and a clock signal transmitted from an external system such as a graphic card or a television system. The image data and the data control signal are transmitted to the data driving unit 125, and the gate control signal is transmitted to the first and second gate driving units 130 and 135.

The data driving unit 125 (e.g., a circuit) generates a data signal (a data voltage) Vdata (of FIG. 3) using the data control signal and the image data transmitted from the timing controlling unit 120 and transmits the data signal to a data line DL of the display panel 140.

The first and second gate driving units 130 and 135 (e.g., circuits) generate a gate signal (a gate voltage) using the gate control signal transmitted from the timing controlling unit 120 and applies the gate signal to a gate line GL of the display panel 140. For example, the gate signal may include a scan signal Sc (of FIG. 4), a sensing signal Se (of FIG. 4) and an emission signal.

The first and second gate driving units 130 and 135 may be a gate in panel (GIP) type formed in a non-display area NDA of a substrate of the display panel 140 having the gate line GL, the data line DL and a pixel P.

Although the first and second gate driving units 130 and 135 are disposed in both side portions of the display panel 140 in the embodiment of FIG. 1, one gate driving unit may be disposed in one side portion of the display panel 140 in another embodiment.

The display panel 140 includes a display area DA at a central portion thereof and a non-display area NDA adjacent to and surrounding the display area DA. The display panel 140 displays an image using the gate signal and the data signal Vdata. For displaying an image, the display panel 140 includes a plurality of pixels P, a plurality of gate lines GL and a plurality of data lines DL in the display area DA.

Each of the plurality of pixels P includes first, second, third and fourth subpixels SP1, SP2, SP3 and SP4, and the gate line GL and the data line DL cross each other to define the first, second, third and fourth subpixels SP1, SP2, SP3 and SP4. Each of the first, second, third and fourth subpixels SP1, SP2, SP3 and SP4 is connected to the gate line GL and the data line DL. For example, the first, second, third and fourth subpixels SP1, SP2, SP3 and SP4 may correspond to red, green, blue and white, respectively.

Figure 4:
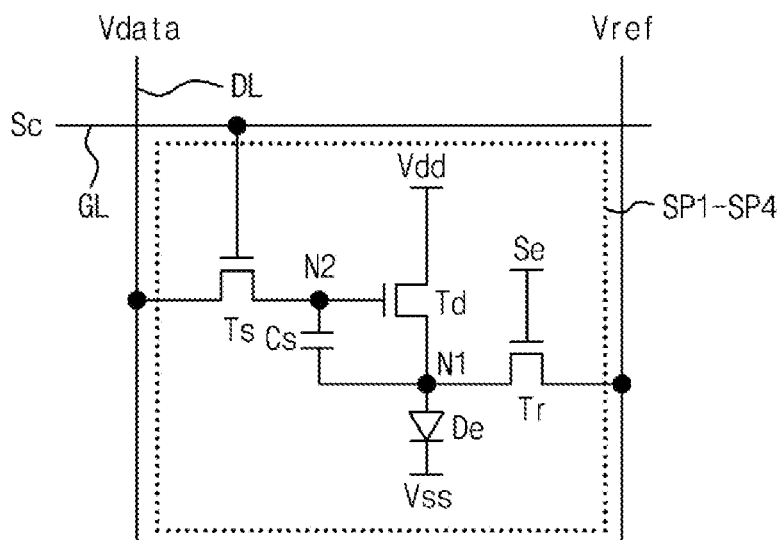
FIG. 4 is a circuit diagram showing a subpixel of a 3T1C structure of a display apparatus according to an embodiment of the present disclosure.

When the display apparatus 110 is an OLED display apparatus, each of the first, second, third and fourth subpixels SP1, SP2, SP3 and SP4 may include a plurality of transistors such as a switching transistor Ts (of FIG. 4), a driving transistor Td (of FIG. 4) and a reference transistor Tr (of FIG. 4), a storage capacitor Cs (of FIG. 4) and a light emitting diode De (of FIG. 4).

A structure and an operation of the first and second gate driving units 130 and 135 and the first, second, third and fourth subpixels SP1, SP2, SP3 and SP4 of the display apparatus 110 will be illustrated with reference to a drawing.

Figure 2:
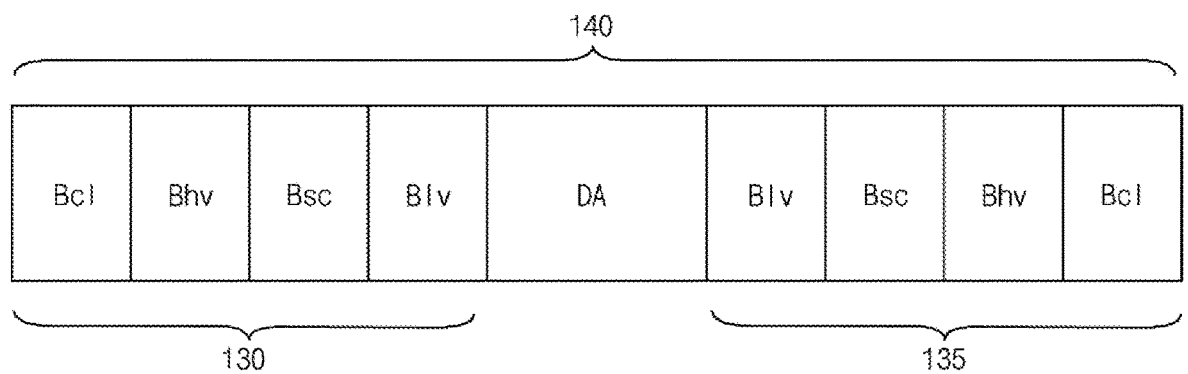
FIG. 2 is block diagram showing first and second gate driving units and a display panel of a display apparatus according to an embodiment of the present disclosure.
Figure 3:
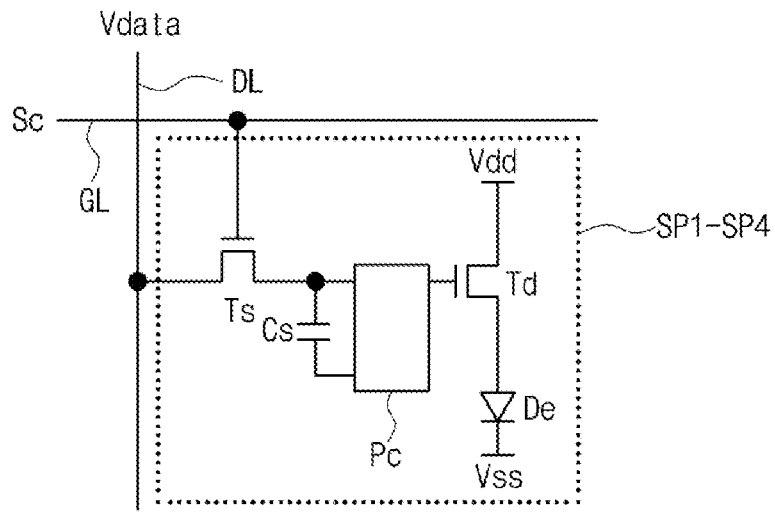
FIG. 3 is a circuit diagram showing a subpixel of a display apparatus according to an embodiment of the present disclosure.

FIG. 2 is block diagram showing first and second gate driving units and a display panel of a display apparatus according to an embodiment of the present disclosure, and FIG. 3 is a circuit diagram showing a subpixel of a display apparatus according to an embodiment of the present disclosure. The display apparatus 110 may be an organic light emitting diode (OLED) display apparatus.

In FIG. 2, each of the first and second gate driving units 130 and 135 of the display apparatus 110 according to an embodiment of the present disclosure includes a clock signal block Bcl (e.g., a circuit), a high-level voltage block Bhv (e.g., a circuit), a stage circuit block Bsc (e.g., a circuit) and a low-level voltage block Blv (e.g., a circuit), and the display area DA is disposed between the first and second gate driving units 130 and 135.

In another embodiment, the disposition structure of the clock signal block Bcl, the high-level voltage block Bhv, the stage circuit block Bsc and the low-level voltage block Blv in the first and second gate driving units 130 and 135 may be variously changed.

Each of the first and second gate driving units 130 and 135 may include a shift register including a plurality of stages connected to each other in a cascade type.

The clock signal block Bcl includes a plurality of clock lines transmitting a clock signal used in the stage circuit block Bsc.

For example, the clock signal may include a carry clock signal transmitted between one stage and another stage of the shift register, a scan clock signal used for generation of the scan signal Sc of the gate signal supplied to the display area DA of the display panel 140 and a sensing clock used for generation of the sensing signal Se of the gate signal supplied to the display area DA of the display panel 140.

The clock signal block Bcl may include a carry clock block including the clock line transmitting the carry clock signal, a scan clock block including the clock line transmitting the scan clock signal and a sensing clock block including the clock line transmitting the sensing clock signal.

The high-level voltage block Bhv includes a plurality of power lines transmitting the high-level voltage and the control signal of the first and second gate driving units 130 and 135.

For example, the high-level voltage of the first and second gate driving units 130 and 135 may include a high-level voltage for a shift register and a high-level voltage for an inverter of each stage, and the control signal of the first and second gate driving units 130 and 135 may include a start signal corresponding to an operation start of a first stage, a reset signal corresponding to an operation end of a last stage and a real time signal used for generation of a compensation signal in an operation for a real time compensation.

The stage circuit block Bsc as one stage of the shift register includes a plurality of transistors and a plurality of capacitors, and generates and outputs the gate signal including the carry signal, the scan signal Sc and the sensing signal Se. The carry signal is transmitted to the other stage, and the scan signal Sc and the sensing signal Se are transmitted to the display area DA.

For example, the stage circuit block Bsc may include a compensation block for an operation of a real time operation, a carry block including a line transmitting the carry signal to the other stage, a logic block substantially generating a plurality of output signals and a buffer block outputting the scan signal Sc and the sensing signal Se of the gate signal supplied to the display area DA of the display panel 140.

The stage circuit block Bsc may include a plurality of transistors and a plurality of capacitors.

The low-level voltage block Blv includes the plurality of power lines transmitting the low-level voltage of the first and second gate driving units 130 and 135.

In the first and second gate driving units 130 and 135, the stage block Bsc generates the carry signal, the scan signal Sc and the sensing signal Se using the carry clock signal, the scan clock signal and the sensing clock signal transmitted from the clock signal block Bcl. The carry signal is transmitted to the other stage circuit block Bsc, and the scan signal Sc and the sensing signal Se are transmitted to each subpixel SP1, SP2, SP3 and SP4 of the display area DA.

In FIG. 3, each of the first, second, third and fourth subpixels SP1, SP2, SP3 and SP4 of the display panel 140 of the display apparatus 110 according to an embodiment of the present disclosure includes a switching transistor Ts, a driving transistor Td, a compensation part Pc, a storage capacitor Cs and a light emitting diode De. The switching transistor Ts and the driving transistor Td may be an oxide semiconductor thin film transistor or a low temperature polycrystalline silicon thin film transistor.

The switching transistor Ts is switched according to the scan signal Sc of the gate signal. A gate electrode of the switching transistor Ts is connected to the gate line GL supplying the scan signal Sc, a source electrode of the switching transistor Ts is connected to a first capacitor electrode of the storage capacitor Cs and the compensation part Pc, and a drain electrode of the switching transistor Ts is connected to the data line DL supplying the data signal Vdata.

The driving transistor Td is switched according to a voltage of the compensation part Pc. A gate electrode of the driving transistor Td is connected to the compensation part Pc, a source electrode of the driving transistor Td is connected to an anode of the light emitting diode De, and a drain electrode of the driving transistor Td is connected to the high-level voltage Vdd.

The compensation part Pc is connected among the switching transistor Ts, the driving transistor Td and the storage capacitor Cs and compensates a variation of the threshold voltage Vth of the driving transistor Td.

The storage capacitor Cs stores the data signal Vdata. A first capacitor electrode of the storage capacitor Cs is connected to the source electrode of the switching transistor Ts and the compensation part Pc, and a second capacitor electrode of the storage capacitor Cs is connected to the compensation part Pc.

The light emitting diode De is connected between the driving transistor Td and the low-level voltage Vss and emits a light of a luminance proportional to a current of the driving transistor Td. An anode of the light emitting diode De is connected to the source electrode of the driving transistor Td, and a cathode of the light emitting diode De is connected to the low-level voltage Vss.

The data signal Vdata is supplied from the data driving unit 125 to each subpixel SP1, SP2, SP3 and SP4 of the display panel 140, and the scan signal Sc of the gate signal is supplied from the first and second gate driving units 130 and 135 to each subpixel SP1, SP2, SP3 and SP4 of the display panel 140.

Each of the first, second, third and fourth subpixels SP1, SP2, SP3 and SP4 may have one of 3T1C structure including three transistors and one capacitor, 6T1C structure including six transistors and one capacitor, 7T1C structure including seven transistors and one capacitor and 8T1C structure including eight transistors and one capacitor. However, embodiments of the present disclosure are not limited thereto. Alternatively, each of the first, second, third and fourth subpixels SP1, SP2, SP3 and SP4 may have one of 4T3C structure, 5T2C structure, 6T2C structure, and 7T2C structure including two capacitors.

A 3T1C structure of each subpixel SP1, SP2, SP3 and SP4 will be illustrated with reference to a drawing.

FIG. 4 is a circuit diagram showing a subpixel of a 3T1C structure of a display apparatus according to an embodiment of the present disclosure.

In FIG. 4, each of the first, second, third and fourth subpixels SP1, SP2, SP3 and SP4 of the display panel 140 of the display apparatus 110 according to an embodiment of the present disclosure includes a switching transistor Ts, a driving transistor Td, a reference transistor Tr, a storage capacitor Cs and a light emitting diode De. The switching transistor Ts, the driving transistor Td and the reference transistor Tr may be an oxide semiconductor thin film transistor or a low temperature polycrystalline silicon thin film transistor.

The switching transistor Ts is switched according to a scan signal Sc of the gate signal. A gate electrode of the switching transistor Ts is connected to the gate line GL supplying the scan signal Sc, a source electrode of the switching transistor Ts is connected to a first capacitor electrode of the storage capacitor Cs and a gate electrode of the driving transistor Td, and a drain electrode of the switching transistor Ts is connected to the data line DL supplying the data signal Vdata.

The driving transistor Td is switched according to a voltage of the first capacitor electrode of the storage capacitor Cs. A gate electrode of the driving transistor is connected to the source electrode of the switching transistor Ts and the first capacitor electrode of the storage capacitor Cs, a source electrode of the driving transistor Td is connected to a second capacitor electrode of the storage capacitor Cs, an anode of the light emitting diode De and a source electrode of the reference transistor Tr, and a drain electrode of the driving transistor Td is connected to the high-level voltage Vdd.

The reference transistor Tr is switched according to a sensing signal Se of the gate signal. A gate electrode of the reference transistor Tr is connected to a gate line supplying the sensing signal Se, a source electrode of the reference transistor Tr is connected to the source electrode of the driving transistor Td, the second capacitor electrode of the storage capacitor Cs, and the anode of the light emitting diode De, and a drain electrode of the reference transistor Tr is connected to the reference signal Vref.

The storage capacitor Cs stores the data signal Vdata compensated with a threshold voltage Vth of the driving transistor Td. The first capacitor electrode of the storage capacitor Cs is connected to the source electrode of the switching transistor Ts and the gate electrode of the driving transistor Td, and the second capacitor electrode of the storage capacitor Cs is connected to the source electrode of the driving transistor Td, the source electrode of the reference transistor Tr and the anode of the light emitting diode De.

The light emitting diode De is connected between the driving transistor Td and the low-level voltage Vss and emits a light of a luminance proportional to a current of the driving transistor Td. The anode of the light emitting diode De is connected to the source electrode of the driving transistor Td, the second capacitor electrode of the storage capacitor Cs and the source electrode of the reference transistor Tr, and a cathode of the light emitting diode De is connected to the low-level voltage Vss.

The data signal Vdata and the reference signal Vref are supplied from the data driving unit 125 to each subpixel SP1 to SP4 of the display panel 140, and the scan signal Sc and the sensing signal Se of the gate signal are supplied from the first and second gate driving units 130 and 135 to each subpixel SP1 to SP4 of the display panel 140.

The source electrode of the driving transistor Td, the source electrode of the reference transistor Tr, the second capacitor electrode of the storage capacitor Cs and the anode of the light emitting diode De are connected to each other to constitute a first node N1, and the gate electrode of the driving transistor Td, the source electrode of the switching transistor Ts and the first capacitor electrode of the storage capacitor Cs are connected to each other to constitute a second node N2.

In the display apparatus 110, during an initialization period where the reference transistor Tr is turned on, the reference signal Vref is supplied to the first node N1 and the first and second nodes N1 and N2 are initialized. During a writing period where the switching transistor Ts is turned on and off, the data signal Vdata is applied to the second node N2 and the threshold voltage of the driving transistor Td is stored in the storage capacitor Cs. During a sensing period where the reference transistor Tr is turned on again, the data driving unit 125 detects the threshold voltage of the driving transistor Td stored in the storage capacitor Cs and transmits the threshold voltage to the timing controlling unit 120.

Next, the timing controlling unit 120 modifies the data signal Vdata to generate a compensated data signal where the threshold voltage is compensated and supply the compensated data signal to each subpixel SP1 to SP4 through the data driving unit 125. During an emission period where the switching transistor Ts is turned on, a current corresponding to the compensated data signal is supplied to the light emitting diode De through the driving transistor Td and the light emitting diode De emits a light.

A cross-sectional structure of each subpixel will be illustrated with reference to a drawing.

Figure 5:
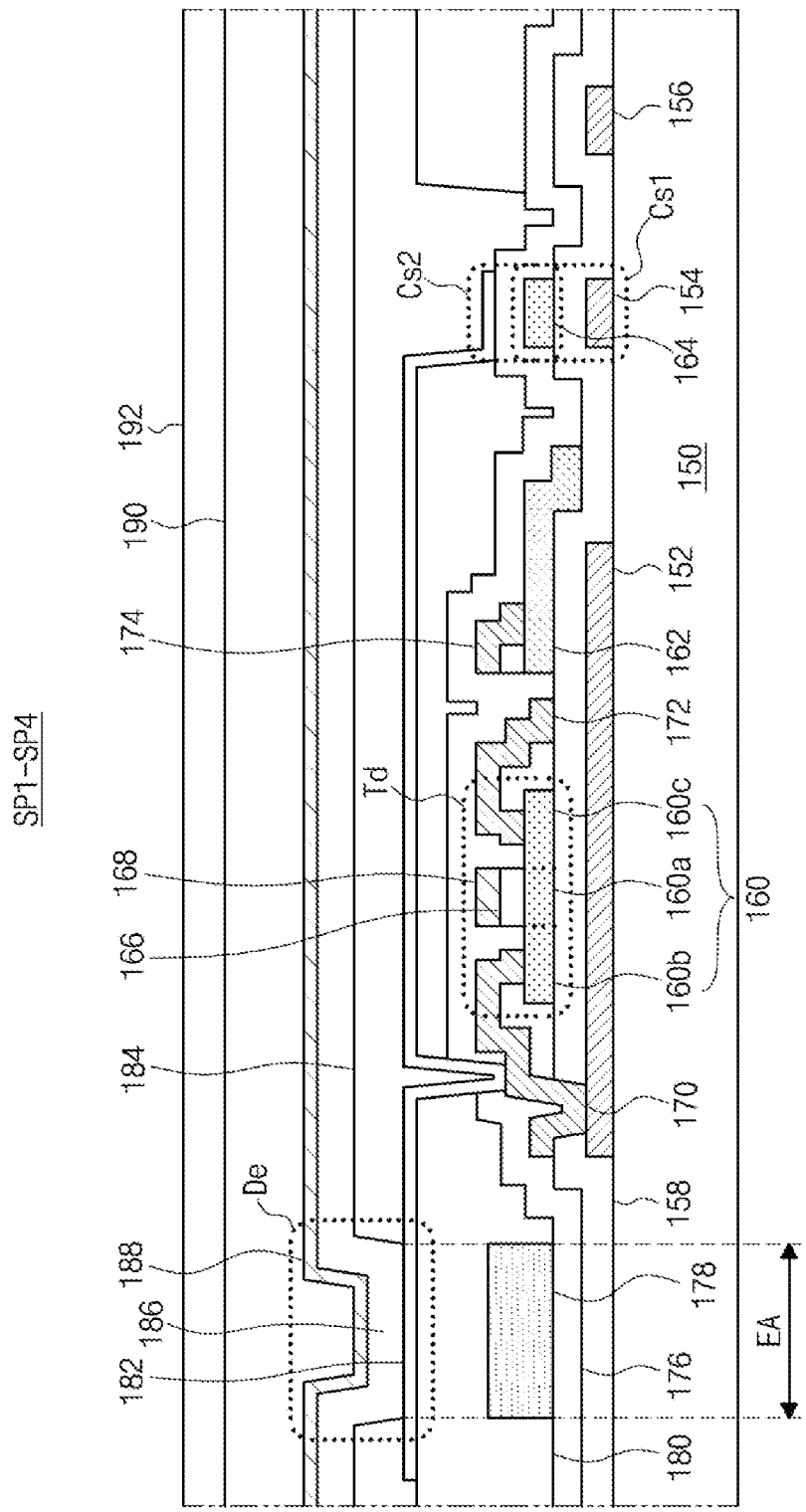
FIG. 5 is a cross-sectional view showing a subpixel of a display apparatus according to an embodiment of the present disclosure.

FIG. 5 is a cross-sectional view showing a subpixel of a display apparatus according to an embodiment of the present disclosure.

In FIG. 5, each subpixel SP1 to SP4 of the display apparatus 110 according to an embodiment of the present disclosure includes the driving transistor Td and the light emitting diode De.

A light shielding layer 152, a first capacitor pattern 154 and a data line 156 are disposed on a substrate 150.

The substrate 150 may include glass. However, embodiments of the present disclosure are not limited thereto. Alternatively, the substrate 150 may include a multiple layer where an organic layer and an inorganic layer are alternately laminated. For example, the substrate 150 may include an organic insulating material layer such as polyimide (PI) and an inorganic insulating material layer such as silicon oxide (SiO2) alternately laminated.

The light shielding layer 152, the first capacitor pattern 154 and the data line 156 may have the same layer and the same material as each other through a single mask process. The light shielding layer 152, the first capacitor pattern 154 and the data line 156 may include a metallic material.

For example, the light shielding layer 152, the first capacitor pattern 154 and the data line 156 may have a single layer or multiple layers including one of molybdenum (Mo), aluminum (Al), chromium (Cr), gold (Au), titanium (Ti), nickel (Ni), neodymium (Nd), copper (Cu) and an alloy thereof.

A buffer layer 158 is disposed on the light shielding layer 152, the first capacitor pattern 154 and the data line 156 over the entire substrate 150. The buffer layer 158 may block moisture penetrable from an exterior. For example, the buffer layer 158 may have a multiple layer of an inorganic material such as silicon oxide (SiOx) or silicon nitride (SiNx).

An active layer 160 and a semiconductor layer 162 are disposed on the buffer layer 158 corresponding to the light shielding layer 152, and a second capacitor pattern 164 is disposed on the buffer layer 158 corresponding to the first capacitor pattern 154.

The active layer 160, the semiconductor layer 162 and the second capacitor pattern 164 may have the same layer and the same material as each other through a single mask process. The active layer 160, the semiconductor layer 162 and the second capacitor pattern 164 may include polycrystalline silicon or oxide semiconductor material.

The active layer 160 may have a channel region 160a at a central portion thereof and source and drain regions 160b and 160c at both side portions of the channel region 160a. The channel region 160a may include an intrinsic semiconductor material without an impurity, and the source and drain regions 160b and 160c may include an impurity doped semiconductor material. In this case, the active layer 160 may include polycrystalline silicon.

However, embodiments of the present disclosure are not limited thereto. Alternatively, when the active layer 160 includes oxide semiconductor material, the channel region 160a, the source region 160b, and the drain region 160c may include an intrinsic semiconductor material without an impurity.

The first capacitor pattern 154, the buffer layer 158 and the second capacitor pattern 164 constitute a first storage capacitor Cs1.

A patterned gate insulating layer 166 is disposed on the channel region 160a, the source region 160b and the drain region 160c of the active layer 160 and the semiconductor layer 162. The gate insulating layer 166 may have a single layer or a multiple layer of an inorganic insulating material such as silicon oxide (SiO2) and silicon nitride (SiNx).

A gate electrode 168, a source electrode 170 and a drain electrode 172 are disposed on the gate insulating layer 166 corresponding to the channel region 160a, the source region 160b and the drain region 160c, respectively, of the active layer 160, and a gate line 174 is disposed on the gate insulating layer 166 corresponding to the semiconductor layer 162.

The gate electrode 168, the source electrode 170, the drain electrode 172 and the gate line 174 may be in a same layer and have a same material as each other through a single mask process. The gate electrode 168, the source electrode 170, the drain electrode 172 and the gate line 174 may include a metallic material.

For example, the gate electrode 168, the source electrode 170, the drain electrode 172 and the gate line 174 may have a single layer or multiple layers including one of molybdenum (Mo), aluminum (Al), chromium (Cr), gold (Au), titanium (Ti), nickel (Ni), neodymium (Nd), copper (Cu) and an alloy thereof.

The gate electrode 168 does not contact the channel region 160a of the active layer 160. On the other hand, the source electrode 170 contacts the light shielding layer 152 through a contact hole of the buffer layer 158 and the source region 160b of the active layer 160 through a side surface of the gate insulating layer 166. Further, the drain electrode 172 contacts the drain region 160c of the active layer 160 through the side surface of the gate insulating layer 166, and the gate line 174 contacts the semiconductor layer 162 through the side surface of the gate insulating layer 166.

In another embodiment, an additional metal layer may be disposed between the active layer 160 and the source electrode 170 and between the active layer 160 and the drain electrode 172. The metal layer may be formed simultaneously with the active layer 160 through a photolithographic process using a half transmissive mask.

The active layer 160, the gate insulating layer 166, the gate electrode 168, the source electrode 170 and the drain electrode 172 constitute the driving transistor Td.

In the embodiment of the present disclosure, the source and drain electrodes 170 and 172 are described as being formed of the same material and on the same layer as the gate electrode 168, but embodiments of the present disclosure are not limited thereto.

In other embodiments, the source and drain electrodes 170 and 172 may be formed of the same material as and on a different layer from the gate electrode 168 or formed of a different material and on a different layer from the gate electrode 168. In this case, the data line 156 may be formed of the same material and on the same layer as the source and drain electrodes 170 and 172.

A passivation layer 176 is disposed on the gate electrode 168, the source electrode 170, the drain electrode 172, the gate line 174 and the second capacitor pattern 164 over the entire substrate 150. The passivation layer 176 may have a single layer or a multiple layer of an inorganic insulating material such as silicon oxide (SiOx) and silicon nitride (SiNx).

A color filter layer 178 is disposed in an emission area EA on the passivation layer 176. For example, the color filter layer 178 of the first, second, third and fourth subpixels SP1, SP2, SP3 and SP4 may correspond to red, green, blue and white colors, respectively.

An overcoat layer 180 is disposed on the color filter layer 178 over the entire substrate 150. The overcoat layer 180 may include an organic insulating material such as polyimide (PI) and acrylic resin.

A first electrode 182 is disposed on the overcoat layer 180 and is connected to the source electrode 170 through a contact hole in the overcoat layer 180 and the passivation layer 176. The first electrode 182 may be an anode of a multiple layer including a transparent conductive material.

For example, the transparent conductive material may include a material having a relatively high work function such as indium tin oxide (ITO) and indium zinc oxide (IZO).

The first electrode 182 extends from the emission area EA to overlap the second capacitor pattern 164. The second capacitor pattern 164, the passivation layer 176 and the first electrode 182 constitute a second storage capacitor Cs2.

The first and second storage capacitors Cs1 and Cs2 are connected to each other in parallel to constitute the storage capacitor Cs (of FIG. 3).

A bank layer 184 is disposed on the first electrode 182 to cover an edge portion of the first electrode 182. The bank layer 184 has an opening exposing a central portion of the first electrode 182, and the opening of the bank layer 184 corresponds to the emission area EA.

For example, the bank layer 184 may include an opaque material (e.g., black material) to prevent or at least reduce light interference between the adjacent subpixels SP1 to SP4. The bank layer 184 may include a shielding material of at least one of a color pigment, an organic black and a carbon.

However, embodiments of the present disclosure are not limited thereto. Alternatively, the bank layer 184 may include a transparent material. For example, the bank layer 184 may include at least one material of an inorganic insulating material such as silicon oxide (SiOx) and silicon nitride (SiNx) or an organic insulating material such as benzocyclobutene (BCB), acrylic resin, epoxy resin, phenolic resin, polyamide resin, or polyimide resin.

Although not shown, a spacer may be disposed on the bank layer 184.

An emitting layer 186 is disposed on the bank layer 184 and the first electrode 182 exposed through the opening of the bank layer 184. The emitting layer 186 may include a hole relating layer, an organic emitting layer and an electron relating layer sequentially or reversely laminated.

For example, the emitting layer 186 may include a hole injecting layer, a hole transporting layer, an emitting material layer, an electron transporting layer and an electron injecting layer.

A second electrode 188 is disposed on the emitting layer 186 over the entire substrate 150. The second electrode 188 may be a cathode of a multiple layer including an opaque conductive material having a relatively high reflection efficiency.

For example, the opaque conductive material may include a material having a relatively low work function such as aluminum (Al), silver (Ag), copper (Cu), lead (Pb), molybdenum (Mo), titanium (Ti) and an alloy thereof.

The first electrode 182, the emitting layer 186 and the second electrode 188 constitute the light emitting diode De.

Although the display apparatus 110 has a bottom emission type where the first electrode 182 includes a transparent material and the second electrode 188 has an opaque material having a relatively high reflectance in an embodiment of FIG. 5, the display apparatus 110 may have a top emission type where the first electrode 182 includes an opaque material having a relatively high reflectance and the second electrode 188 includes a transparent or semi-transparent material and the color filter layer 178 is disposed on the second electrode 188 in another embodiment.

A first encapsulating layer 190 and a second encapsulating layer 192 are sequentially disposed on the second electrode 188 over the entire substrate 150 as an encapsulation member. The first encapsulating layer 190 and the second encapsulating layer 192 may prevent moisture or oxygen of an exterior from permeating the light emitting diode De.

For example, the first encapsulating layer 190 may include a non-photosensitive organic insulating material such as acrylic resin, epoxy resin, phenolic resin, polyamide resin, polyimide resin, polyethylene and silicon oxycarbon (SiOC) or a photosensitive organic insulating material such as photoacryl. Alternatively, the first encapsulating layer 190 may include an inorganic insulating material such as silicon nitride (SiNx), silicon oxide (SiOx), or aluminum oxide (AlyOz) or may have a structure where at least one inorganic insulating material and at least one organic insulating material are stacked.

The second encapsulating layer 192 may include a metallic material. For example, the second encapsulating layer 192 may include iron (Fe), nickel (Ni), titanium (Ti), molybdenum (Mo), copper (Cu), aluminum (Al), silver (Ag), chromium (Cr), gold (Au), neodymium (Nd), or alloys thereof, but embodiments of the present disclosure are not limited thereto.

Alternatively, when the display apparatus 110 may have a top emission type, the second encapsulating layer 192 may include a transparent insulating material. For example, the second encapsulating layer 192 may include glass.

In the organic light-emitting diode display apparatus 110, a link line is formed in the non-display area NDA in order to apply a signal to the first and second gate driving units 130 and 135, and this will be described with reference to drawings.

Figure 6:
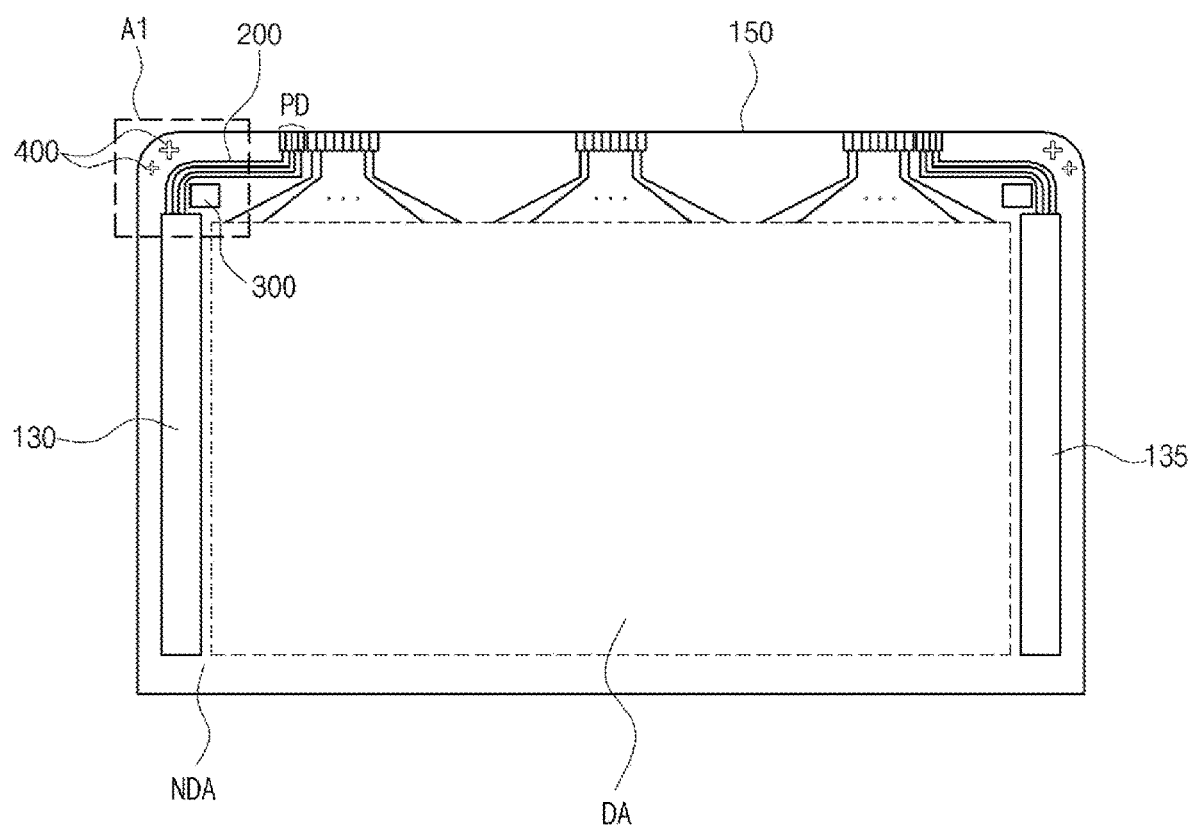
FIG. 6 is a plan view schematically illustrating a display panel of an organic light-emitting diode display apparatus according to an embodiment of the present disclosure.

FIG. 6 is a plan view schematically illustrating a display panel of an organic light-emitting diode display apparatus according to an embodiment of the present disclosure.

In FIG. 6, the display panel 140 of the display apparatus 110 according to an embodiment of the present disclosure includes the display area DA at a central portion thereof and the non-display area NDA surrounding the display area DA on the substrate 150.

At least one corner of the substrate 150 may have a rounded shape, and other corners may have angled shapes. Here, left and right corners of an upper end of the substrate 150 may have substantially rounded shapes, and left and right corners of a lower end of the substrate 150 may have angled shapes.

However, embodiments of the present disclosure are not limited thereto. Alternatively, all corners of the substrate 150 may have substantially rounded shapes.

The non-display area NDA includes first, second, third, and fourth non-display areas respectively disposed at left, right, upper and lower sides of the display area DA in the context of the figure. The third non-display area disposed at the upper side may have a larger area than the first, second, and fourth non-display areas.

Here, the first and second gate driving units 130 and 135 are disposed at the first and second non-display areas, respectively, and the printed circuit board including the timing controlling unit 120 and the data driving unit 125 are connected to the third non-display area.

In addition, a link line 200 is provided in the third non-display area to provide the gate control signal from the timing controlling unit 120 to each of the first and second gate driving units 130 and 135. The link line 200 is disposed to correspond to each of the left and right corners of the upper side of the substrate 150 in the context of the figure. The link line 200 is provided in a line on glass (LOG) manner formed on the substrate 150 together with patterns of the display area DA.

In the embodiment of the present disclosure, the first and second gate driving units 130 and 135 and the corresponding left and right configurations of the non-display area NDA of the display panel 140 are substantially the same as each other. Accordingly, for convenience of description, the following description will be made based on the first gate driving unit 130 and the corresponding left configuration of the non-display area NDA, and the first gate driving unit 130 will be referred to as the gate driving unit 130. Therefore, the features mentioned below for the gate driving unit 130 and the corresponding configuration equally apply to the first and second gate driving units 130 and 135 and the corresponding configurations.

Next, a first end of the link line 200 is connected to a pad portion PD connected to the timing controlling unit 120, and a second end of the link line 200 is connected to the gate driving unit 130. However, the present disclosure is not limited to it. In one embodiment, a first end of the link line 200 may be connected to the timing controlling unit 120, and a second end of the link line 200 may be connected to the gate driving unit 130. For example, the first end of the link line 200 may be connected to terminals of the timing controlling unit 120.

The gate control signal is transmitted from the timing controlling unit 120 to the gate driving unit 130 through the link line 200. For example, the gate control signal may include a scan clock signal, a carry clock signal, a gate high-level voltage, a start signal, a reset signal, and a real time signal. However, embodiments of the present disclosure are not limited thereto.

The link line 200 includes a substantially curved portion, and this will be described in detail later.

An electrostatic discharge (ESD) circuit unit 300 is provided between the link line 200 and the gate driving unit 130 and between the link line 200 and the display area DA.

The ESD circuit unit 300 is disposed adjacent to the link line 200 and is connected to the link line 200 to discharge static electricity flowing into the link line 200, thereby protecting the gate driving unit 130.

An alignment key 400 is provided between the link line 200 and the rounded corner of the substrate 150. The alignment key 400 may have a substantially cross shape. However, embodiments of the present disclosure are not limited thereto.

Figure 7:
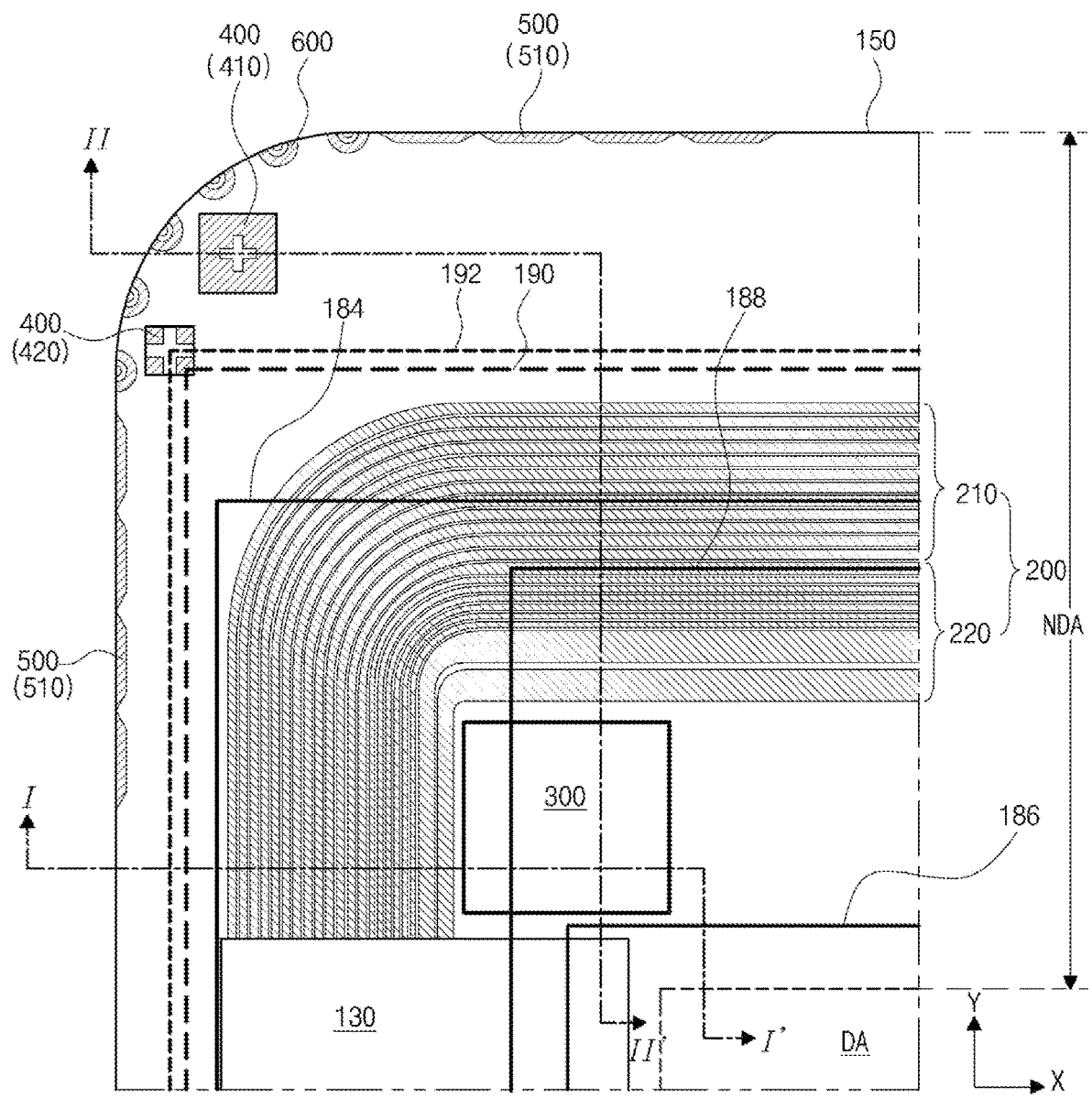
FIG. 7 is a schematically enlarged plan view of the area A1 of the display panel of FIG. 6 according to an embodiment of the present disclosure.
Figure 8:
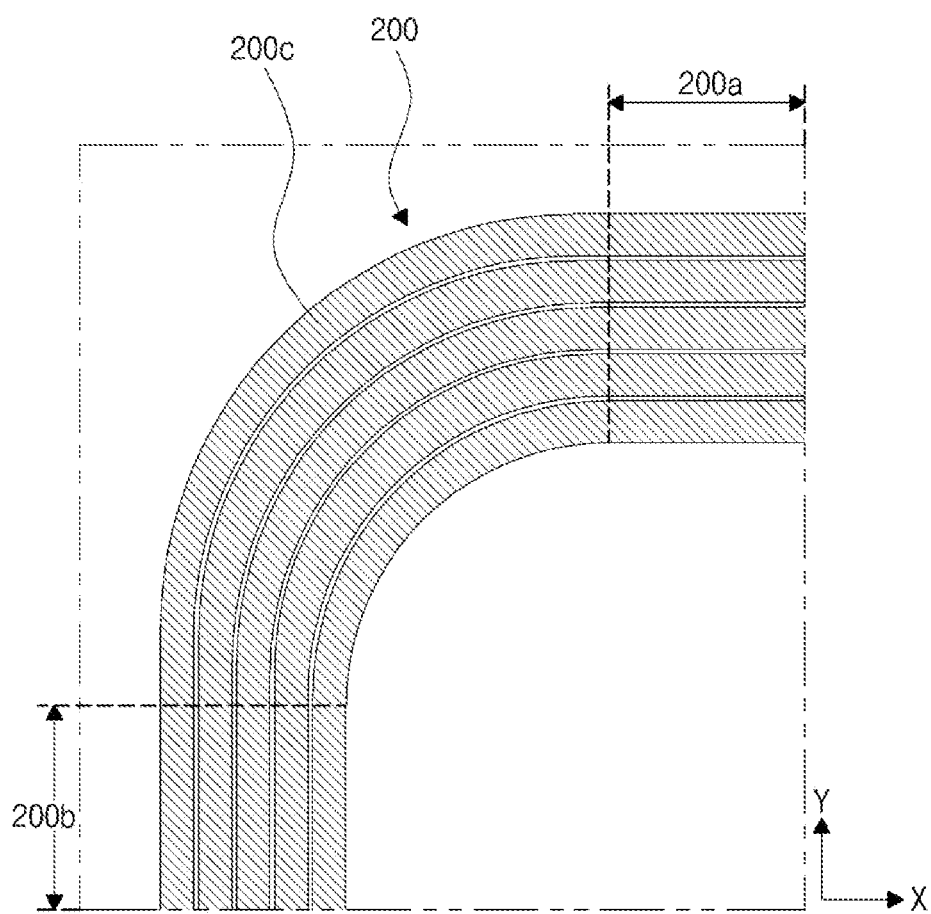
FIG. 8 is a schematically enlarged view of a portion of the link line of FIG. 7 according to an embodiment of the present disclosure.
Figure 9:
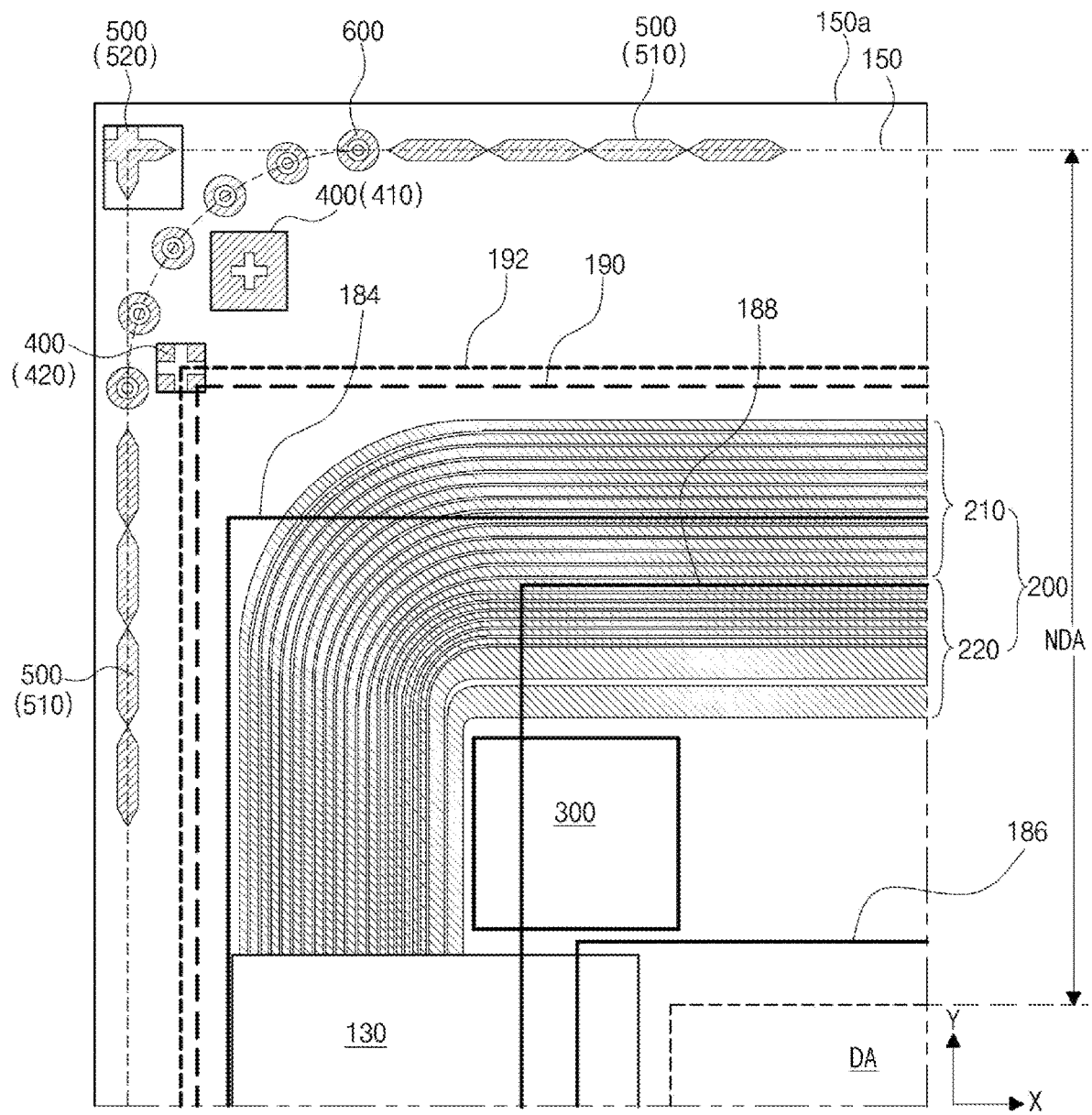
FIG. 9 is a schematic plan view of a mother substrate for the display panel of FIG. 7 according to an embodiment of the present disclosure.

FIG. 7 is a schematically enlarged plan view of the area A1 of the display panel of FIG. 6 according to an embodiment of the present disclosure, FIG. 8 is a schematically enlarged view of a portion of the link line of FIG. 7 according to an embodiment of the present disclosure, and FIG. 9 is a schematic plan view of a mother substrate for the display panel of FIG. 7 according to an embodiment of the present disclosure.

In FIG. 7, the display area DA and the non-display area NDA are provided on the substrate 150. The plurality of subpixels SP1, SP2, SP3, and SP4 are provided in the display area DA. The gate driving unit 130, the link line 200, the ESD circuit unit 300, the alignment key 400, a scribing key 500, and a grinding key 600 are provided in the non-display area NDA.

Specifically, the gate driving unit 130 is disposed at one side of the display area DA along a first direction, which is the X direction, that is, at the left side of the display area DA, and the link line 200 is disposed at one sides of the display area DA and the gate driving unit 130 along a second direction, which is the Y direction, that is, at the upper sides of the display area DA and the gate driving unit 130.

As shown in FIG. 8, the link line 200 includes a first link portion 200a extending in the first direction, a second link portion 200b extending in the second direction, and a third link portion 200c connecting the first and second link portions 200a and 200b and having a substantially curved shape.

The link line 200 includes a plurality of first lines 210 transmitting the scan clock signal and a plurality of second lines 220 transmitting the carry clock signal, the gate high-level voltage, the start signal, the reset signal, and the real time signal. The second lines 220 are disposed between the first lines 210 and the display area DA.

In the embodiment of the present disclosure, the link line 200 is configured to have the substantially curved shape, so that the gate control signal from the timing controlling unit 120 can be substantially uniformly input to the gate driving unit 130.

Namely, when the link line 200 is configured to have an angled shape, a potential concentration occurs in the angled portion. In addition, the farther the link line 200 is located from the display area DA, the higher the line resistance and the higher the possibility of potential concentration. The voltage level of the gate control signal decreases due to this potential concentration, and the potential of the gate control signal input to the gate driving unit 130 is not uniform. Accordingly, gate dims, which are horizontal line patterns, occur in the displayed image, and the image quality of the display apparatus is lowered.

However, in the embodiment of the present disclosure, the link line 200 includes the third link portion 200c having a substantially curved shape, so that the resistance difference between adjacent lines of the link line 200 can be minimized or at least reduced and the potential concentration can be prevented. Accordingly, the gate control signal having uniform potential can be input from the timing controlling unit 120 to the gate driving unit 130. The gate dims can be prevented, and the image quality of the display apparatus can be improved.

Next, in the non-display area NDA, the ESD circuit unit 300 is disposed between the first link portion 200a of the link line 200 and the gate driving unit 130. The ESD circuit unit 300 includes a plurality of discharge elements, each of which is connected to the link line 200. Each discharge element includes at least one transistor. The transistor can have a structure in which a source electrode and a gate electrode are diode-connected.

Meanwhile, as described above, the corner of the substrate 150 adjacent to the link line 200 has the substantially rounded shape. The rounded corner can prevent or minimize the occurrence of cracks due to external impact compared to the angle corner. In addition, even if a crack occurs, the distance between the curved link line 200 and the rounded corner of the substrate 150 is more uniform than the distance between the angled link line and the angled corner of the substrate, so that damage to the signal line and/or element due to the crack can be prevented or minimized.

A plurality of grinding keys 600 are provided at the rounded corner of the substrate 150. Each of the grinding keys 600 may have a substantially semicircular shape.

In addition, a plurality of scribing keys 500 are provided at edges of the substrate 150 adjacent to the grinding keys 600. The scribing keys 500 may be formed at first and second edges of the substrate 150, which are parallel to the first and second directions, respectively. Each of the scribing keys 500 may have a substantially polygonal shape. For example, the scribing key 500 may have a rectangular shape with two sides parallel to each other, but embodiments of the present disclosure are not limited thereto.

The alignment key 400 is provided between the rounded corner of the substrate 150 and the link line 200. That is, the alignment key 400 is disposed between the link line 200 and the grinding keys 600.

The alignment key 400 may include a main alignment key 410 and an auxiliary alignment key 420. Each of the main alignment key 410 and the auxiliary alignment key 420 may include a substantially cross shape. Specifically, each of the main alignment key 410 and the auxiliary alignment key 420 may have an opening of the cross shape in a rectangular pattern. However, embodiments of the present disclosure are not limited thereto.

The alignment key 400, the scribing keys 500, and the grinding keys 600 may be formed of the same material and on the same layer as each other. In addition, the alignment key 400, the scribing keys 500, and the grinding keys 600 may be formed of a different material and on a different layer from the link line 200.

Further, the light emitting diode De is provided at each subpixel SP1, SP2, SP3, and SP4 of the display area DA, and the light emitting diode De includes the first electrode 182, the emitting layer 186, and the second electrode 188.

Here, the first electrode 182 is provided for each subpixel SP1, SP2, SP3, and SP4, and the emitting layer 186 and the second electrode 188 are commonly provided for all subpixels SP1, SP2, SP3, and SP4.

Here, the emitting layer 186 has a larger area than the display area DA, overlaps a portion of the gate driving unit 130, and is spaced apart from the link line 200 and the ESD circuit unit 300. However, embodiments of the present disclosure are not limited thereto. Alternatively, the emitting layer 186 may overlap the portion of the gate driving unit 130 and a portion of the ESD circuit unit 300 and may be spaced apart from the link line 200.

In addition, the second electrode 188 has a larger area than the display area DA and the emitting layer 186, overlaps a portion of the gate driving unit 130 and a portion of the ESD circuit unit 300, and partially overlaps the link line 200.

The second electrode 188 is spaced apart from the first lines 210 of the link line 200 and overlaps a portion of the second lines 220. Specifically, the second electrode 188 is spaced apart from the first lines 210 transmitting the scan clock signal and overlaps the portion of the second lines 220 transmitting the carry clock signal, the gate high-level voltage, the start signal, the reset signal, or the real time signal. In this case, the second electrode 188 may overlap the first link portions 200a of the second lines 220 and may be spaced apart from the second and third link portions 200b and 200c of the second lines 220.

The scan clock signal affects an output of the gate driving unit 130. When the second electrode 188 overlaps the first lines 210, a distorted gate signal may be output, and horizontal line patterns may be shown on a screen. Accordingly, it is desirable that the second electrode 188 is spaced apart from the first lines 210 of the link line 200.

However, embodiments of the present disclosure are not limited thereto. Alternatively, the second electrode 188 may overlap all of the first lines 210 and the second lines 220 of the link line 200 and completely cover the first lines 210 and the second lines 220.

The bank layer 184 is provided between the first electrode 182 and the emitting layer 186. A boundary of the bank layer 184 is beneficially disposed between the edges of the second electrode 188 and the substrate 150. The bank layer 184 may overlap a portion of the first lines 210 of the link line 200 and all of the second lines 220 of the link line 200. In this case, the bank layer 184 may overlap the first, second, and third link portions 200a, 200b, and 200c of one first line 210, be spaced apart from the first link portion 200a of another first line 210, and overlap the second and third link portions 200b and 200c of the another first line 210.

Meanwhile, each of the first encapsulating layer 190 and the second encapsulating layer 192 provided over the light emitting diode De has a smaller area than the substrate 150 and a larger area than the emitting layer 186, the second electrode 188, and the bank layer 184. Each of the first encapsulating layer 190 and the second encapsulating layer 192 overlaps the display area DA, the gate driving unit 130, the link line 200, and the ESD circuit unit 300. In addition, each of the first encapsulating layer 190 and the second encapsulating layer 192 may be spaced apart from the scribing keys 500 and the grinding keys 600 and overlap at least one of the main alignment key 410 and the auxiliary alignment key 420. For example, each of the first encapsulating layer 190 and the second encapsulating layer 192 may be spaced apart from the main alignment key 410 and overlap a portion of the auxiliary alignment key 420.

The display panel of FIG. 7 may be formed on a mother substrate 150a and then completed through two cutting processes.

Specifically, as shown in FIG. 9, the plurality of subpixels SP1, SP2, SP3, and SP4 of the display area DA and the gate driving unit 130, the link line 200, the ESD circuit unit 300, the alignment key 400, the scribing keys 500, and the grinding keys 600 of the non-display area NDA are formed on the mother substrate 150, and the first and second encapsulating layers 190 and 192 are formed. Then, the mother substrate 150a is scribed along the scribing keys 500, thereby performing a first cutting process.

Here, the scribing keys 500 include first scribing keys 510 and a second scribing key 520. The first scribing keys 510 are formed to correspond to the edges of the substrate 150, and the second scribing key 520 is formed to be spaced apart from the grinding keys 600 and to correspond to the corner of the substrate 150. The first scribing keys 510 may have a polygonal shape extending along the edge of the substrate 150, and the second scribing key 520 may have a substantially cross shape.

After the first cutting process, the substrate 150 has an angled corner.

Next, a second cutting process is performed by grinding the angled corner of the substrate 150 along the grinding keys 600.

In this case, the grinding keys 60 may have a circular shape.

After the second cutting process, the substrate 150 has the rounded corner.

A cross-sectional structure of the display panel according to an embodiment of the present disclosure will be described with reference to FIG. 10 and FIG. 11.

Figure 10:
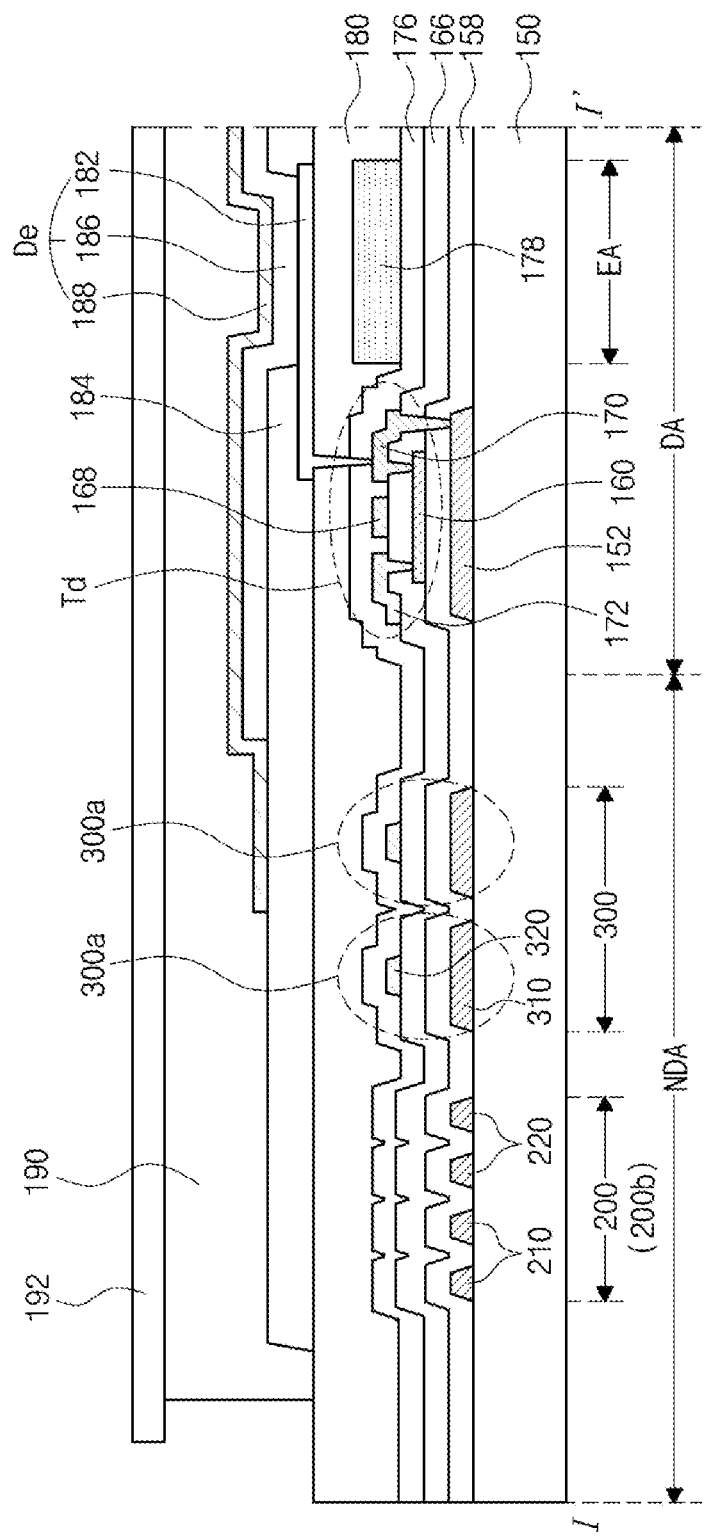
FIG. 10 is a cross-sectional view corresponding to line I-I' of FIG. 7 according to an embodiment of the present disclosure.
Figure 11:
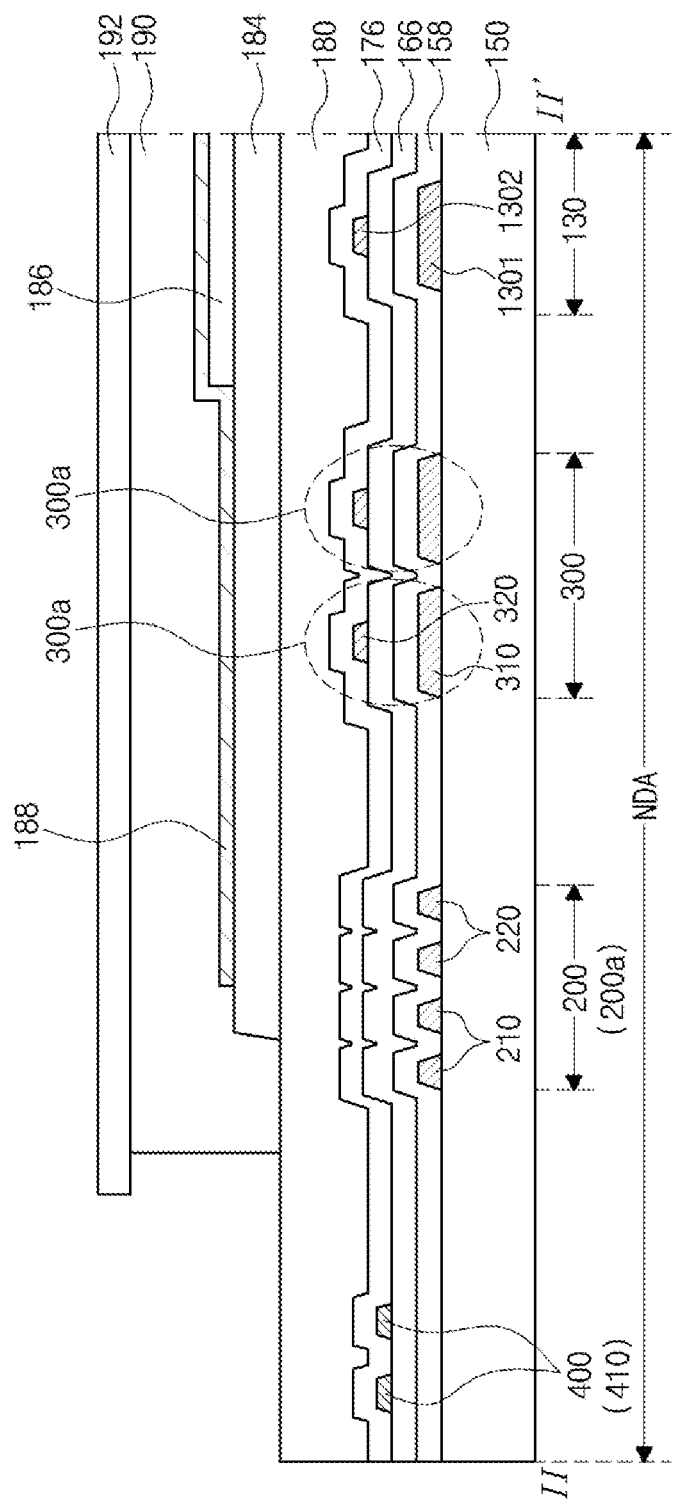
FIG. 11 is a cross-sectional view corresponding to line II-II' of FIG. 7 according to an embodiment of the present disclosure.

FIG. 10 is a cross-sectional view corresponding to line I-I' of FIG. 7 according to an embodiment of the present disclosure, and FIG. 11 is a cross-sectional view corresponding to line II-II' of FIG. 7 according to an embodiment of the present disclosure. Here, the structure of the display area DA has substantially the same configuration as that described in FIG. 5, and explanation for the same configuration will be omitted or shortened.

In FIG. 10 and FIG. 11, the light shielding layer 152, the driving transistor Td, the light emitting diode De, and the color filter layer 178 are provided in the display area DA on the substrate 150, and the gate driving unit 130, the link line 200, the ESD circuit unit 300, the alignment layer 400, the scribing keys 500, and the grinding keys 600 are provided in the non-display area NDA on the substrate 150.

Here, the driving transistor Td includes the gate electrode 168, the active layer 160, the source electrode 170, and the drain electrode 172. The light emitting diode De includes the first electrode 182, the emitting layer 186, and the second electrode 188.

The gate driving unit 130 includes at least one first driving layer 1301 and at least one second driving layer 1302. The at least one first driving layer 1301 and the at least one second driving layer 1302 may be a line or a component of a transistor or a capacitor.

The ESD circuit unit 300 includes a plurality of discharge elements 300a. Each discharge element 300a includes at least one first element layer 310 and at least one second element layer 320. Each discharge element 300a may include at least one transistor. The first element layer 310 may be a light shielding layer under the transistor, and the second element layer 320 may be a gate electrode or a source or drain electrode.

Specifically, the light shielding layer 152, the first driving layer 1301, the first element layer 310, and the link line 200 are provided on the substrate 150 as a first conductive layer. Accordingly, the light shielding layer 152, the first driving layer 1301, the first element layer 310, and the link line 200 are formed of the same material and on the same layer.

The link line 200 include the first lines 210 transmitting the scan clock signal and the second lines 220 transmitting the carry clock signal, the gate high-level voltage, the start signal, the reset signal, or the real time signal. The link line 200 may be connected to one of the first driving layer 1301 and the second driving layer 1302 of the gate driving unit 130.

The buffer layer 158 is provided on the light shielding layer 152, the first driving layer 1301, the first element layer 310, and the link line 200. The buffer layer 158 is disposed substantially over an entire surface of the substrate 150.

The active layer 160 is provided on the buffer layer 158 corresponding to the light shielding layer 152. Although not shown in the figures, each of the gate driving unit 130 and the ESD circuit unit 300 may include a semiconductor pattern disposed on the buffer layer 158 and formed of the same material as the active layer 160.

The gate insulating layer 166 is provided on the active layer 160. The gate insulating layer 166 may be disposed substantially over the entire surface of the substrate 150.

The gate electrode 168, the source electrode 170, the drain electrode 172, the second driving layer 1302, the second element layer 320, and the alignment key 400 are provided on the gate insulating layer 166 as a second conductive layer. Meanwhile, although not shown in the figures, the scribing keys 500 and the grinding keys 600 are provided on the gate insulating layer 166. Accordingly, the gate electrode 168, the source electrode 170, the drain electrode 172, the second driving layer 1302, the second element layer 320, the alignment key 400, the scribing keys 500, and the grinding keys 600 are formed of the same material and on the same layer.

The gate electrode 168, the source electrode 170, and the drain electrode 172 are disposed to correspond to the active layer 160. The source electrode 170 and the drain electrode 172 are in contact with respective end regions of the active layer 160 through contact holes of the gate insulating layer 166, and the source electrode 170 is in contact with the light shielding layer 152 through a contact hole of the gate insulating layer 166 and the buffer layer 158.

The second driving layer 1302 of the gate driving unit 130 may overlap the first driving layer 1301. The second driving layer 1302 may be in contact with the first driving layer 1301. However, embodiments of the present disclosure are not limited thereto. The second driving layer 1302 may be spaced apart from the first driving layer 1301.

In addition, the second element layer 320 of the ESD circuit unit 300 may overlap the first element layer 310.

Next, the passivation layer 176 is provided on the gate electrode 168, the source electrode 170, the drain electrode 172, the second driving layer 1302, the second element layer 320, and the alignment key 400. The passivation layer 176 is disposed substantially over the entire surface of the substrate 150.

The color filter layer 178 is provided in the emission area EA on the passivation layer 176.

The overcoat layer 180 is provided on the color filter layer 178. The overcoat layer 180 is disposed substantially over the entire surface of the substrate 150.

The first electrode 182 is provided on the overcoat layer 180. The first electrode 182 is in contact with the source electrode 170 through a contact hole of the overcoat layer 180 and the passivation layer 176.

The bank layer 184 is provided on the first electrode 182. The bank layer 184 has an opening exposing the first electrode 182 corresponding to the emission area EA and extends into the non-display area NDA.

The bank layer 184 overlaps a portion of the link line 200. In this case, the bank layer 184 may overlap the link line 200 except for the first link portion 200a of at least one first line 210. Specifically, the bank layer 184 may overlap the second link portion 200b of the at least one first line 210, the first and second link portions 200a and 200b of the remaining first line 210, and the first and second link portions 200a and 200b of all second lines 220.

The emitting layer 186 is provided on the bank layer 184. The emitting layer 186 is disposed substantially over an entire surface of the display area DA and extends into the non-display area NDA. The emitting layer 186 overlaps a portion of the gate driving unit 130 and is spaced apart from the link line 200, the ESD circuit unit 300, and the alignment key 400.

The second electrode 188 is provided on the emitting layer 186. The second electrode 188 is disposed substantially over the entire surface of the display area DA and extends into the non-display area NDA.

The second electrode 188 overlaps a portion of the ESD circuit unit 300. Specifically, the second electrode 188 may be spaced apart from at least one discharge element 300a and may overlap the remaining discharge element 300a.

In addition, the second electrode 188 overlaps a portion of the link line 200. Specifically, the second electrode 188 overlaps a portion of the second lines 220 of the link line 200 and is spaced apart from the first lines 210 of the link line 200. In this case, the second electrode 188 may overlap the first link portions 200a of the second lines 220.

The first encapsulating layer 190 and the second encapsulating layer 192 are sequentially provided on the second electrode 188 as an encapsulation member.

The first encapsulating layer 190 has the larger area than the bank layer 184, the emitting layer 186, and the second electrode 188 and covers the bank layer 184, the emitting layer 186, and the second electrode 188. In the non-display area NDA, the first encapsulating layer 190 is in contact with top and side surfaces of the bank layer 184 and in contact with a top surface of the overcoat layer 180.

The second encapsulating layer 192 may have the larger area than the first encapsulating layer 190 and the smaller area than the substrate 150.

The first and second encapsulating layers 190 and 192 overlap the link line 200 and the ESD circuit unit 300 and are spaced apart from the alignment key 400.

In the organic light-emitting diode display apparatus 110 according to the embodiment of the present disclosure, the link line 200 is configured to have the curved shape, and the gate control signal having uniform potential is input to the gate driving unit 130, so that the gate dim can be prevented, and the image quality of the display apparatus can be improved.

Further, the corner of the substrate 150 adjacent to the link line 200 is configured to have the substantially rounded shape, so that the occurrence of cracks due to the external impact can be minimized or at least reduced, and the damage due to the crack can be prevented or minimized or at least reduced.

In the present disclosure, the link line connected to the gate driving unit have the curved shape. Accordingly, the gate control signal having uniform potential can be input to the gate driving unit, thereby to prevent or at least reduce the gate dim and improve the image quality of the display apparatus.

In addition, in the present disclosure, the corner of the substrate adjacent to the link line has the substantially rounded shape. Accordingly, the occurrence of the cracks due to the external impact can be minimized or at least reduced, thereby preventing or minimizing or at least reducing the damage due to the crack.

It will be apparent to those skilled in the art that various modifications and variations can be made in the display apparatus of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display apparatus, comprising:
   a substrate including a display area having a subpixel and a non-display area surrounding the display area;
   a driving transistor and a light emitting diode included in the subpixel;
   a gate driving circuit provided in the non-display area; and
   a link line in the non-display area, the link line connected to the gate driving circuit,
   wherein the link line includes a first link portion in a first direction, a second link portion in a second direction, and a third link portion connecting the first link portion and the second link portion and the third link portion having a curved shape,
   wherein the link line includes at least one first line that transmits a scan clock signal and at least one second line that transmits a different signal from the scan clock signal, and
   wherein the at least one first line and the at least one second line have different widths.

2. A display apparatus, comprising:
   a substrate including a display area having a subpixel and a non-display area surrounding the display area;
   a driving transistor and a light emitting diode included in the subpixel;
   a gate driving circuit provided in the non-display area; and
   a link line in the non-display area, the link line connected to the gate driving circuit,
   wherein the link line includes a first link portion in a first direction, a second link portion in a second direction, and a third link portion connecting the first link portion and the second link portion and the third link portion having a curved shape,
   wherein the light emitting diode includes a first electrode, an emitting layer, and a second electrode,
   wherein the link line includes at least one first line that transmits a scan clock signal and at least one second line that transmits a carry clock signal, a gate high-level voltage, a start signal, a reset signal, or a real time signal, and
   wherein the second electrode is spaced apart from the at least one first line and overlaps a portion of the at least one second line.

3. The display apparatus of claim 2, wherein the second electrode overlaps the first link portion of the at least one second line and is spaced apart from the second link portion and the third link portion of the at least one second line.

4. The display apparatus of claim 2, wherein the second electrode overlaps a portion of the gate driving circuit.

5. The display apparatus of claim 2, wherein the emitting layer has an area that is larger than an area of the display area and is spaced apart from the link line.

6. The display apparatus of claim 2, further comprising:
   an electrostatic discharge circuit in the non-display area and between the first link portion of the link line and the gate driving circuit,
   wherein the second electrode overlaps a portion of the electrostatic discharge gate driving circuit.

7. The display apparatus of claim 6, wherein the electrostatic discharge circuit includes a plurality of discharge elements, and the second electrode is spaced apart from at least one of the plurality of discharge elements and overlaps other discharge elements of the plurality of discharge elements.

8. The display apparatus of claim 1, wherein a corner of the substrate that is adjacent to the link line has a rounded shape.

9. The display apparatus of claim 8, further comprising:
a scribing key at an edge of the substrate, the scribing key having a polygonal shape; and
a grinding key at the corner of the substrate, the grinding key having a semicircular shape.

10. The display apparatus of claim 9, further comprising:
an alignment key between the grinding key and the third link portion of the link line.

11. The display apparatus of claim 10, wherein the scribing key, the grinding key, and the alignment key comprise a same material and are on a same layer as a gate electrode of the driving transistor, and
wherein the link line comprises a same material and is on a same layer as a light shielding layer that is under the driving transistor.

12. The display apparatus of claim 2, further comprising:
a bank layer between the first electrode and the emitting layer, the bank layer overlapping a portion of the at least one first line and the at least one second line of the link line.

13. The display apparatus of claim 2, further comprising:
an encapsulation member over the light emitting diode, the encapsulation member overlapping the at least one first line and the at least one second line of the link line.

14. The display apparatus of claim 13, wherein the encapsulation member includes a first encapsulating layer and a second encapsulating layer sequentially disposed over the light emitting diode,
wherein the first encapsulating layer includes at least one of an inorganic insulating material and an organic insulating material, and the second encapsulating layer includes a metallic material or glass.

15. The display apparatus of claim 1, wherein the subpixel includes:
a switching transistor switched according to a scan signal, the switching transistor connected to a data signal;
a storage capacitor connected to the switching transistor;
the driving transistor switched according to a voltage of a capacitor electrode of the storage capacitor, the driving transistor connected to a high-level voltage;
a reference transistor switched according to a sensing signal, the reference transistor connected to the storage capacitor, the driving transistor, and receives a reference signal, and
the light emitting diode connected to the storage capacitor, the driving transistor, the reference transistor, and a low-level voltage.

16. The display apparatus of claim 15, wherein at least one of the switching transistor, the driving transistor, and the reference transistor is an oxide semiconductor thin film transistor.

17. The display apparatus of claim 15, wherein the gate driving circuit includes a clock signal block, a high-level voltage block, a stage circuit block, and a low-level voltage block, and
wherein the stage circuit block generates and transmits the scan signal to the switching transistor through a gate line and generates and transmits the sensing signal to the reference transistor through the gate line.

18. The display apparatus of claim 1, further comprising:
a light shielding layer included in the subpixel;
a buffer layer between the light shielding layer and the driving transistor;
an overcoat layer between the driving transistor and the light emitting diode; and
a passivation layer between the driving transistor and the overcoat layer.

19. The display apparatus of claim 18, wherein the driving transistor includes:
an active layer corresponding to the light shielding layer and over the buffer layer;
a gate insulating layer and a gate electrode sequentially disposed over the active layer;
a source electrode connected to a first end region of the active layer and the light shielding layer; and
a drain electrode connected to a second end region of the active layer.

20. A display apparatus, comprising:
a substrate including a display area having a subpixel and a non-display area surrounding the display area;
a driving transistor and a light emitting diode included in the subpixel;
a gate driving circuit at a first side portion of the substrate in the non-display area;
a timing controlling circuit at a second side portion adjacent to the first side portion of the substrate in the non-display area; and
a link line extending from the first side portion to the second side portion in the non-display area,
wherein a first end of the link line is connected to the timing controlling circuit, and a second end of the link line is connected to the gate driving circuit, and transmits a gate control signal from the timing controlling circuit to the gate driving circuit,
wherein the link line includes at least one first line that transmits a scan clock signal and at least one second line that transmits a different signal from the scan clock signal, and
wherein the at least one first line and the at least one second line have different widths.

21. The display apparatus of claim 20, wherein a portion of the link line at a corner portion of the substrate between the first side portion and the second side portion has a curved shape.

22. The display apparatus of claim 20, further comprising:
an electrostatic discharge circuit in the non-display area, the electrostatic discharge circuit between a first link portion of the link line and the gate driving circuit,
wherein a second electrode overlaps a portion of the electrostatic discharge circuit.

23. The display apparatus of claim 21, wherein the corner portion of the substrate has a rounded shape.

24. The display apparatus of claim 21, further comprising:
a scribing key at an edge of the substrate, the scribing key having a polygonal shape; and
a grinding key at the corner portion of the substrate, the grinding key having a semicircular shape.

25. The display apparatus of claim 1, wherein the light emitting diode includes a first electrode, an emitting layer, and a second electrode, and
wherein the second electrode is spaced apart from the at least one first line and overlaps a portion of the at least one second line.

26. The display apparatus of claim 1, wherein the at least one second line transmits a carry clock signal, a gate high-level voltage, a start signal, a reset signal, or a real time signal.

* * * * *